(12) United States Patent
Tasher et al.

(10) Patent No.: US 7,884,678 B2
(45) Date of Patent: Feb. 8, 2011

(54) SINGLE-PIN RC OSCILLATOR

(75) Inventors: Nir Tasher, Tel Mond (IL); Tamir Golan, Kibutz Givat Haim Meuhad (IL)

(73) Assignee: Nuvoton Technology Corporation, Hsin-Chu (TW)

( * ) Notice: Subject to any disclaimer, the term of this patent is extended or adjusted under 35 U.S.C. 154(b) by 187 days.

(21) Appl. No.: 12/353,307

(22) Filed: Jan. 14, 2009

(65) Prior Publication Data

US 2010/0176891 A1  Jul. 15, 2010

(51) Int. Cl.
  *H03K 3/02* (2006.01)
(52) U.S. Cl. .................. 331/143; 331/108 D; 331/111; 331/150; 331/153
(58) Field of Classification Search ............. 331/108 D, 331/111, 143, 150, 153

See application file for complete search history.

(56) References Cited

U.S. PATENT DOCUMENTS

| 4,122,413 | A |   | 10/1978 | Chen |   |
|---|---|---|---|---|---|
| 5,565,819 | A |   | 10/1996 | Cooper |   |
| 5,592,128 | A | * | 1/1997 | Hwang | ........................ 331/61 |
| 6,653,907 | B2 |   | 11/2003 | Kobota |   |
| 2004/0152427 | A1 | * | 8/2004 | Chiu et al. | ..................... 455/85 |

* cited by examiner

*Primary Examiner*—Arnold Kinkead
*Assistant Examiner*—Richard Tan
(74) *Attorney, Agent, or Firm*—D. Kligler I.P. Services Ltd.

(57) ABSTRACT

Apparatus includes a single-pin input interface, which is operative to sense a voltage across a capacitor of a Resistor-Capacitor (RC) network in which the capacitor is repetitively charging and discharging so that the voltage oscillates as a function of time. A measurement circuit is coupled to measure time durations in which the capacitor is charging and in which the sensed voltage lies between first and second predefined thresholds. A clock generation circuit is coupled to generate an output clock signal having a frequency, and to adjust the frequency responsively to the measured time durations.

20 Claims, 4 Drawing Sheets

SINGLE-PIN RC OSCILLATOR

FIELD OF THE INVENTION

The present disclosure relates generally to signal sources, and particularly to Resistor-Capacitor (RC) oscillators.

BACKGROUND OF THE INVENTION

Various types of circuits and systems use oscillators in order to generate clock signals or other types of signals. In some oscillator designs, the oscillator frequency is determined by a Resistor-Capacitor (RC) network. In some Integrated Circuit (IC) configurations, the oscillator is contained within the IC but the frequency determining RC network is external to the IC. In these configurations, the external RC network is connected to the IC via one or more input pins. Some RC oscillator configurations use only a single pin for connecting to the IC, and are therefore referred to as single-pin configurations.

For example, U.S. Pat. No. 4,122,413, whose disclosure is incorporated herein by reference, describes a single-pin Metal Oxide Semiconductor (MOS) RC oscillator in which a series resistor-capacitor combination is coupled across a source of supply potential so that the capacitor charges toward the supply potential through the resistor. The capacitor is discharged through a shunt-connected switch that is operated by means of a latch. Two inverters, which are coupled to the capacitor, respond to the capacitor charge and operate through logic means to set and reset the latch. The inverters have similar but different thresholds. When the capacitor charge is below both thresholds, the latch is set to turn the switch off so that the capacitor charges. When both thresholds are exceeded, the logic resets the latch to turn the switch on and discharge the capacitor.

SUMMARY OF THE INVENTION

An embodiment of the present invention provides an apparatus, including:

a single-pin input interface, which is operative to sense a voltage across a capacitor of a Resistor-Capacitor (RC) network in which the capacitor is repetitively charging and discharging so that the voltage oscillates as a function of time;

a measurement circuit, which is coupled to measure time durations in which the capacitor is charging and in which the sensed voltage lies between first and second predefined thresholds; and a clock generation circuit, which is coupled to generate an output clock signal having a frequency, and to adjust the frequency responsively to the measured time durations.

In some embodiments, the measurement circuit includes first and second comparators, which are respectively operative to compare the voltage to the first and second thresholds, so as to identify the time durations. The first and second comparators may have respective first and second performance variations that are matched to one another.

In an embodiment, the clock generation circuit includes:

a free-running oscillator, which is operative to generate an initial clock signal at an initial frequency;

a frequency divider, which is operative to process the initial clock signal so as to divide the initial frequency by a programmable division ratio to produce the output clock signal; and circuitry, which is coupled to adjust the programmable division ratio responsively to the measured time durations.

In a disclosed embodiment, the circuitry includes a counter operative to count cycles of the output clock signal produced by the frequency divider, and the circuitry is coupled to enable the counter to count the cycles during the time durations, and is further coupled to make a comparison between the counted cycles in a given time duration and a predetermined reference value, and to adjust the programmable division ratio of the frequency divider responsively to the comparison. The circuitry may be coupled to inhibit the counter from counting the cycles in time intervals in which the capacitor is discharging.

In another embodiment, the capacitor is charging and discharging only at time intervals separated by respective inactive periods, and the clock generation circuit is coupled to adjust the frequency only during the time intervals. In yet another embodiment, the clock generating circuit is coupled to determine a length of a given inactive period responsively to a magnitude of a frequency adjustment applied in a given time interval that precedes the given inactive period.

There is additionally provided, in accordance with an embodiment of the present invention, a method, including:

sensing, via a single-pin input interface, a voltage across a capacitor of a Resistor-Capacitor (RC) network in which the capacitor is repetitively charging and discharging so that the voltage oscillates as a function of time;

measuring time durations in which the capacitor is charging and in which the sensed voltage lies between first and second predefined thresholds;

generating an output clock signal having a frequency; and adjusting the frequency of the output clock signal responsively to the measured time durations.

There is further provided, in accordance with an embodiment of the present invention, apparatus, including:

an oscillator, including:

a single-pin input interface, which is operative to sense a voltage across a capacitor of a Resistor-Capacitor (RC) network, in which the capacitor is charged and discharged so that the voltage oscillates as a function of time;

a measurement circuit, which is coupled to measure time durations in which the capacitor is charged and in which the sensed voltage lies between first and second predefined thresholds; and a clock generation circuit, which is coupled to generate an output clock signal having a frequency, and to adjust the frequency responsively to the measured time durations; and digital computing circuitry, which is configured to perform computational operations using the output clock signal.

The present invention will be more fully understood from the following detailed description of the embodiments thereof, taken together with the drawings in which:

BRIEF DESCRIPTION OF THE DRAWINGS

The present disclosure will be more fully understood from the following detailed description of the embodiments thereof, taken together with the drawings in which.

DETAILED DESCRIPTION OF EMBODIMENTS

Overview

Figure 1:
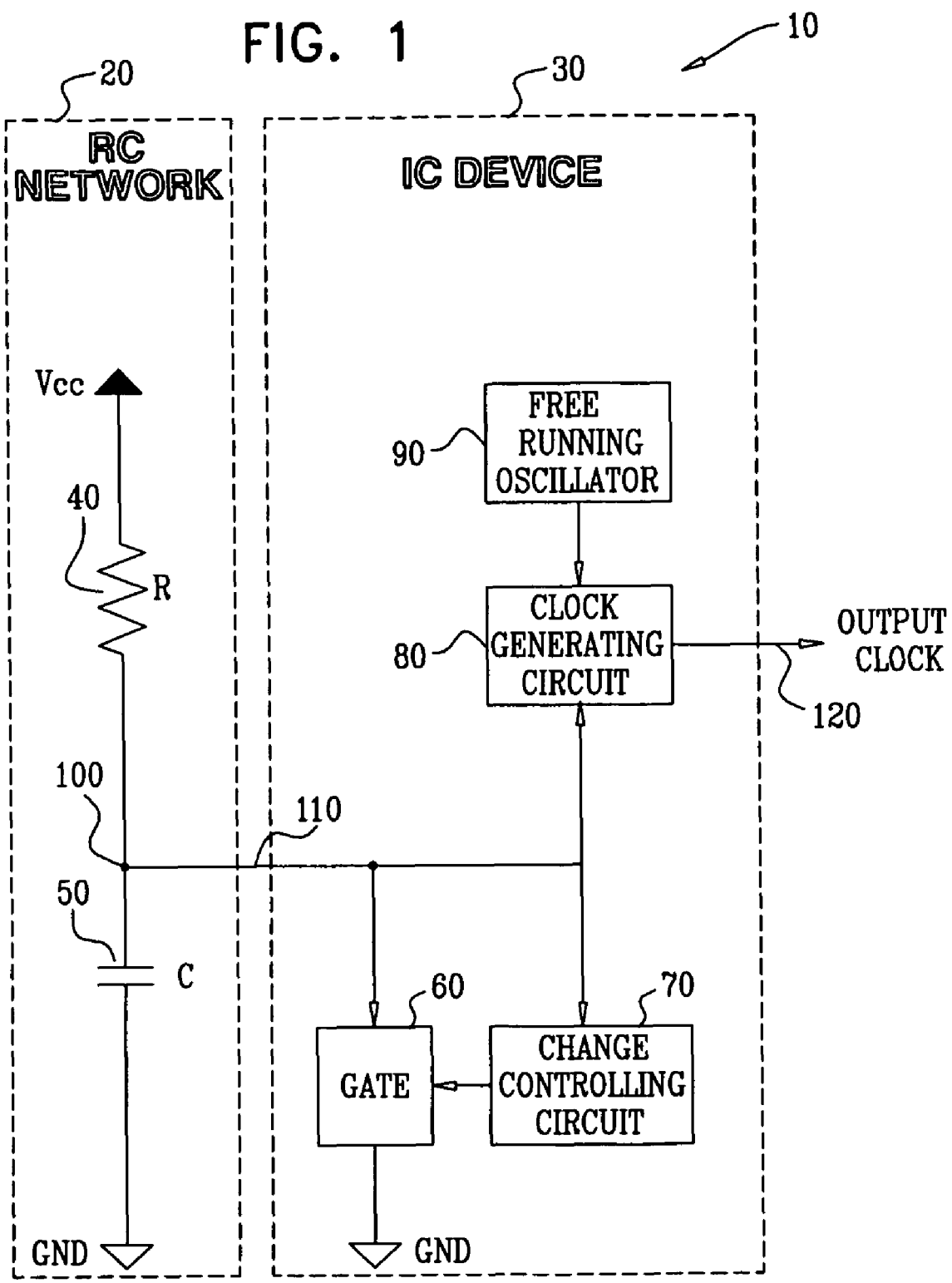
FIG. 1 is a block diagram that schematically illustrates a single-pin RC oscillator, in accordance with an embodiment of the present invention.

In some clock oscillator applications, it is important to generate a clock signal at an accurate frequency. In many RC Oscillator configurations, however, it is difficult to achieve high frequency accuracy, for example because the response times of various oscillator components vary with voltage and temperature. Achieving high accuracy of the oscillation frequency is particularly difficult in single-pin RC oscillators, which do not provide Input/Output (I/O) means for correcting such variations.

Embodiments of the present invention that are described hereinbelow provide improved single-pin RC oscillator configurations, which produce highly accurate output signals. In some embodiments, an RC network is connected to oscillator circuitry, which is implemented in an Integrated Circuit (IC). The RC network comprises a capacitor, which charges and discharges such that the voltage across the capacitor voltage rises and falls as a function of time. The capacitor voltage is typically sensed by the oscillator circuitry via a single-pin interface.

A measurement circuit sets two thresholds over the capacitor voltage. For example, in some embodiments the thresholds are set to ⅓·Vcc and ⅔·Vcc, wherein Vcc denotes the full supply voltage, although any other suitable threshold values can also be used. The measurement circuit measures time durations, in which the capacitor voltage is between the two thresholds. For example, the measurement circuit may comprise a pair of comparators, each indicating whether the capacitor voltage is below or above one of the thresholds.

The measured time durations are provided to a clock generation circuit, which generates an output clock signal. The clock generation circuit adjusts the frequency of the output clock signal based on the measured time durations. For example, the clock generation circuit may comprise a free-running oscillator, whose output is frequency-divided by a frequency divider having a programmable division ratio. The clock generation circuit adjusts the programmable division ratio based on the measured time durations. The frequency-divided output of the free-running oscillator is provided as the output clock signal.

In the oscillator configurations described herein, the frequency of the output clock signal is determined by the time durations in which the capacitor voltage rises from one predefined threshold value to another. These time durations depend on the characteristics of the RC network, and the oscillator circuitry can be designed such that the time durations are unaffected by internal inaccuracies (e.g., response times) of the oscillator circuitry components. Therefore, the disclosed oscillator configurations generate clock signals having highly accurate frequencies, which exhibit little or no variation from unit to unit and under varying operating conditions. This accuracy is achieved while utilizing only a single-pin input from the RC network to the IC, thus minimizing the total pin count of the IC. Maintaining a small number of pins is important in many applications, and especially in small form factor devices, such as devices packaged in 6-32 pin packages.

System Description

FIG. 1 is a block diagram that schematically illustrates a single-pin RC oscillator circuit 10, in accordance with an embodiment of the present invention. Circuit 10 comprises an RC network 20, whose output is provided to an Integrated Circuit (IC) device 30. Circuitry that is fabricated in device 30 produces an accurate clock signal, using techniques that are described in detail below. Device 30 may comprise, for example, a microprocessor, a peripheral device in a Personal Computer (PC), or any other suitable type of IC. Typically, the IC comprises, in addition to the oscillator, digital components that perform various logic and/or computing operations using the accurate clock signal. Such operations may comprise, for example, digital to analog and analog to digital conversion, interfacing, LED blinking and many others.

RC network 20 comprises a resistor 40 and a capacitor 50, which are connected in series across a supply voltage Vcc. The resistance of resistor 40 and the capacitance of capacitor 50 are denoted R and C, respectively. Circuit 10 comprises a gate 60, a charge controlling circuit 70, a clock generating circuit 80 and a free-running oscillator 90, all implemented in device 30. Example implementations of these circuits are given in FIGS. 2 and 5 below.

By opening and closing gate 60, charge controlling circuit 70 causes RC network 20 to charge and discharge, thus producing an oscillatory signal, typically having an exponential, saw-tooth-like waveform. Typically although not necessarily, gate 60 comprises a switch or a transistor whose gate is controlled by circuit 70. In many practical cases, the period of the saw-tooth-like signal is inaccurate, for example due to variations and inaccuracies in device 30. On the other hand, the rise time pattern of the saw-tooth-like signal is inherently accurate, since it depends essentially on the parameters of the RC network. By comparing the accurate rise-time pattern of the saw-tooth-like signal with predetermined voltage thresholds, clock generating circuit 80 produces pulses having an accurate width, and utilizes the accurate width of these pulses to cause the free-running oscillator to produce an accurate output clock signal at a desired frequency. These techniques are explained in greater detail below.

The output of RC network 20 (i.e., a junction 100 between resistor 40 and capacitor 50) is connected to device 30 via an Input/Output (I/O) pin 110. In some embodiments, the clock signal produced by circuit 80 is output via an I/O pin 120. Additionally or alternatively, the clock signal can be used by various types of circuits (not shown) that are fabricated in device 30. Since device 30 typically performs other functions beside clock generation, additional I/O pins may be allocated to other functions.

When gate 60 is open (i.e., does not conduct current), capacitor 50 charges until its voltage reaches Vcc or until gate 60 closes. When gate 60 is closed, capacitor 50 discharges until gate 60 is opened or until the voltage across the capacitor reaches zero. Thus, by controlling gate 60, circuit 70 can enable and disable the discharge path between capacitor 50 and ground, and control the charge/discharge cycle of the RC network. During the charging period, the voltage across the capacitor follows the function $V(t)=Vcc\cdot(1-\exp(-t/RC))$, and is thus fully determined by the parameters of the RC network and the elapsed time. During the discharge period, the voltage across the capacitor follows some function that is dependent not only on the parameters of the RC network, but also on the parameters of the discharge path from junction 110 to ground, such as the conductance of gate 60. The gate conductance may vary from one oscillator to another due to manufacturing process variations, as well as over temperature.

Figure 2:
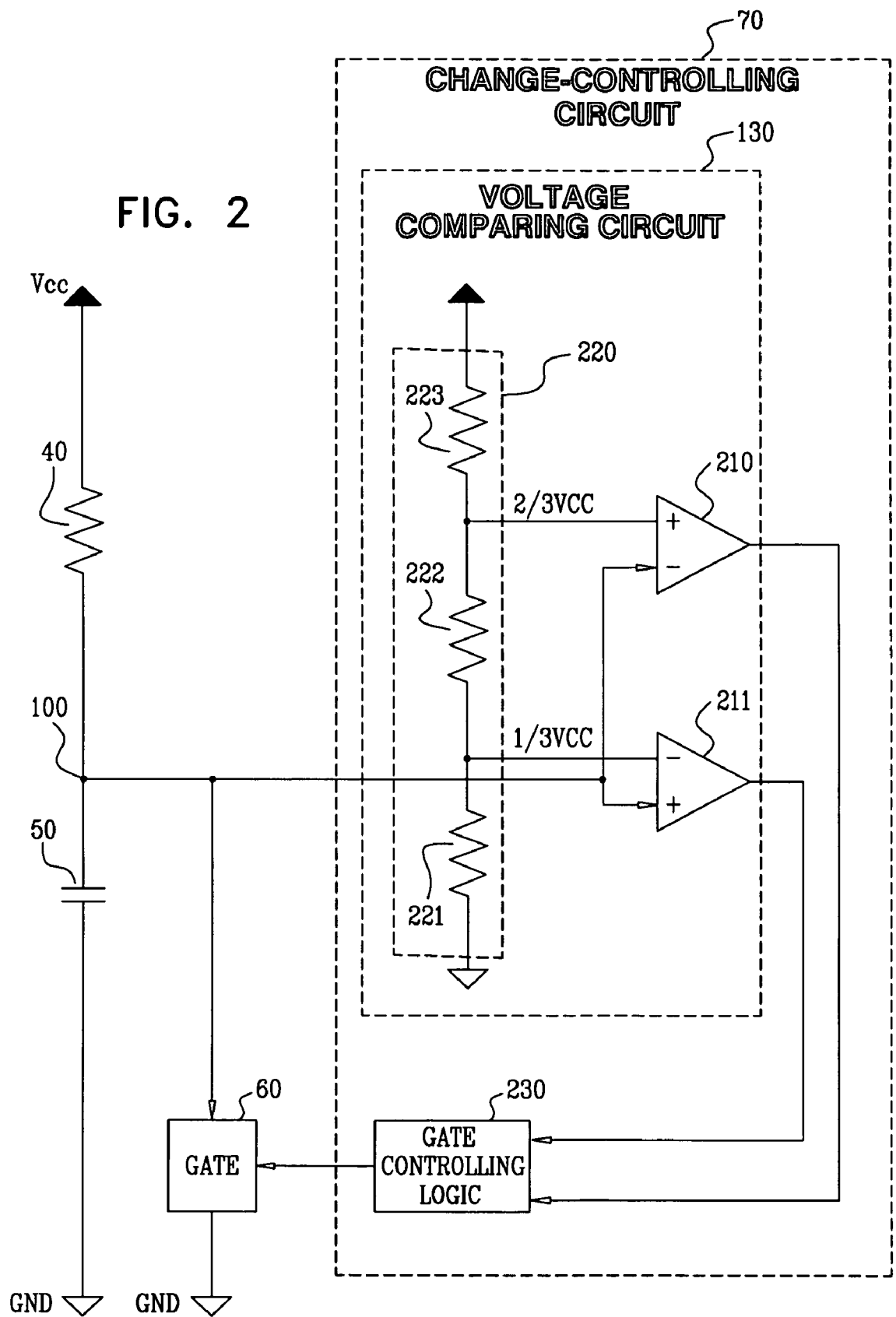
FIG. 2 is a diagram that describes a charge-controlling circuit, in accordance with an embodiment of the present invention.

FIG. 2 is a diagram that describes charge-controlling circuit 70 in greater detail, in accordance with an embodiment of the present invention. In this embodiment, circuit 70 comprises a voltage comparing circuit 130 and gate control logic 230. Voltage comparing circuit 130 compares the voltage across capacitor 50 with predetermined thresholds, and gate control logic 230 opens and closes gate 60 accordingly. Circuit 130 comprises two voltage comparators 210 and 211, and a voltage dividing network 220. Network 220 typically comprises three resistors 221, 222 and 223, which are connected in series between Vcc and ground. The resistance values of the resistors have predetermined ratios. Typically, the three resistors have the same resistances, but other resistance ratios can also be implemented. Alternatively, network 220 may comprise other components.

Comparators 210 and 211 compare the voltage across capacitor 50 with two reference thresholds produced by network 220. In the present example, where resistors 221-223 have the same resistance, network 220 produces two voltages set at ⅓·Vcc and ⅔·Vcc. The first voltage (⅓·Vcc) serves as a reference value to comparator 210, and the second value (⅔·Vcc) serves as a reference value to comparator 211. Alternatively, however, any other suitable reference values can also be used.

The accuracy of the reference values produced by network 220 depend on the accuracy of the ratios between the resistance values of resistors 221-223, and not on the absolute resistance values of the resistors. Since accurate resistance ratios are typically easier to achieve than absolute resistance values, network 220 typically produces highly accurate reference levels.

The outputs of comparators 210 and 211 are utilized by circuit 70 to control gate 60 according to the voltage across capacitor 50. When the capacitor voltage exceeds ⅔·Vcc, logic 230 closes gate 60, thus starting the discharge period. When the voltage drops below ⅓·Vcc, logic 230 opens the gate, thus starting a new charge period. As a result, the voltage across capacitor 50 oscillates in a periodic saw-tooth-like waveform.

Typically, comparators 210 and 211 have matched characteristics. Typically, the comparators are of the same design and are fabricated in close proximity to one another on the same substrate. As such, the performance characteristics of the comparators (e.g., delay as a function of temperature or supply voltage, process variations) may change, but these changes are similar in the two comparators.

Figure 3:
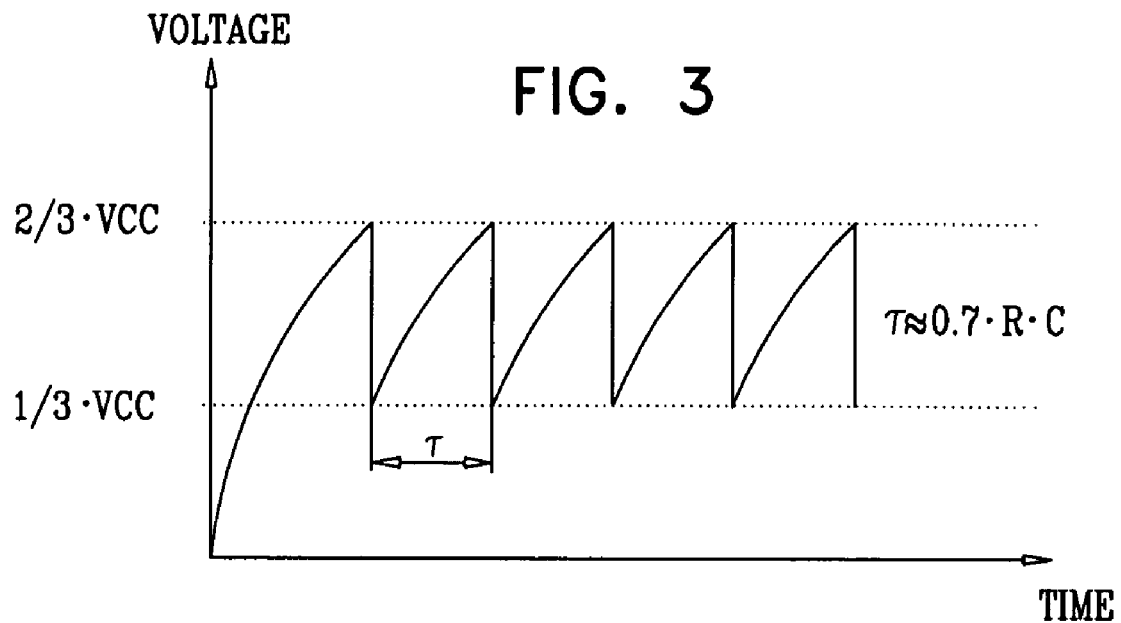
FIGS. 3 and 4 are graphs showing an RC network voltage as a function of time, in accordance with embodiments of the present invention.
Figure 4:
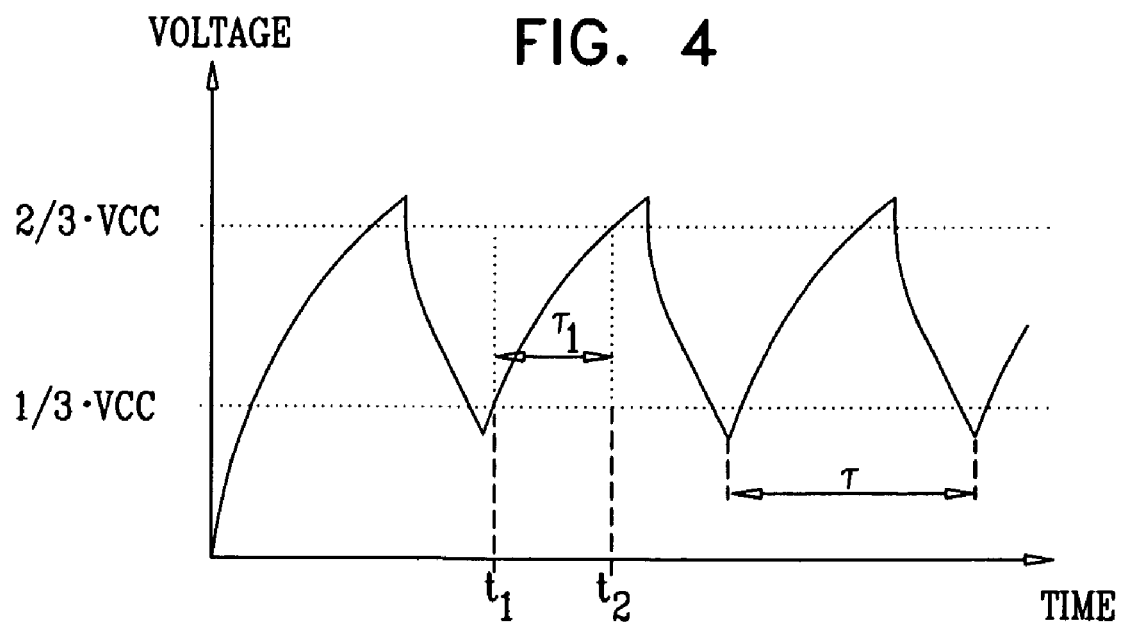

FIGS. 3 and 4 are graphs showing two examples of the voltage across capacitor 50 as a function of time, in accordance with embodiments of the present invention. The example of FIG. 3 refers to an ideal situation, whereas the example of FIG. 4 refers to a more practical scenario. In the example of FIG. 3, the response times of the comparators and of gate 60 are assumed to be zero, and therefore the voltage across the capacitor varies exactly between ⅓·Vcc and ⅔·Vcc. Furthermore, the resistance of the discharge path is also assumed to be zero, and the discharge time is therefore taken to be zero. In this idealized example, the duration $\tau$ of the charge/discharge cycle, which is approximately $0.7 \cdot R \cdot C$ seconds, is independent of the characteristics of IC device 30.

In the practical example of FIG. 4, on the other hand, the response times of the comparators and the gate are not zero. Therefore, the voltage across capacitor 50 exceeds ⅔·Vcc and drops below ⅓·Vcc in each charge/discharge cycle. Furthermore, in many practical cases, the resistance of the discharge path is also not zero, and therefore the capacitor discharges over a certain finite period. The delay of the comparators and the gate, as well as the parameters of the discharge path, may vary between different IC designs, between different devices having the same design (i.e., process variations), and/or between different operating conditions (e.g., temperature or voltage) in a given unit.

Therefore, in practical scenarios, the duration $\tau$ of the charge/discharge cycle signal cannot be considered to be an accurate function of the RC network parameters. Generating a clock signal directly from a waveform of this sort would not achieve an accurate frequency.

Accurate Clock Signal Generation Technique

In order to generate a clock signal having a highly accurate frequency, oscillator circuit 10 does not use the frequency of the charge/discharge process directly. Instead, the circuitry measures the duration (pulse width) of the charging period between the two thresholds (⅓·Vcc and ⅔·Vcc in the present example), and utilizes the accurate duration of this interval to produce the output clock signal. This duration is denoted $\tau_1$ in FIG. 4. The time at which the capacitor voltage reaches ⅓·Vcc is denoted $t_1$, and the time at which the capacitor voltage reaches ⅔·Vcc is denoted $t_2$.

Figure 5:
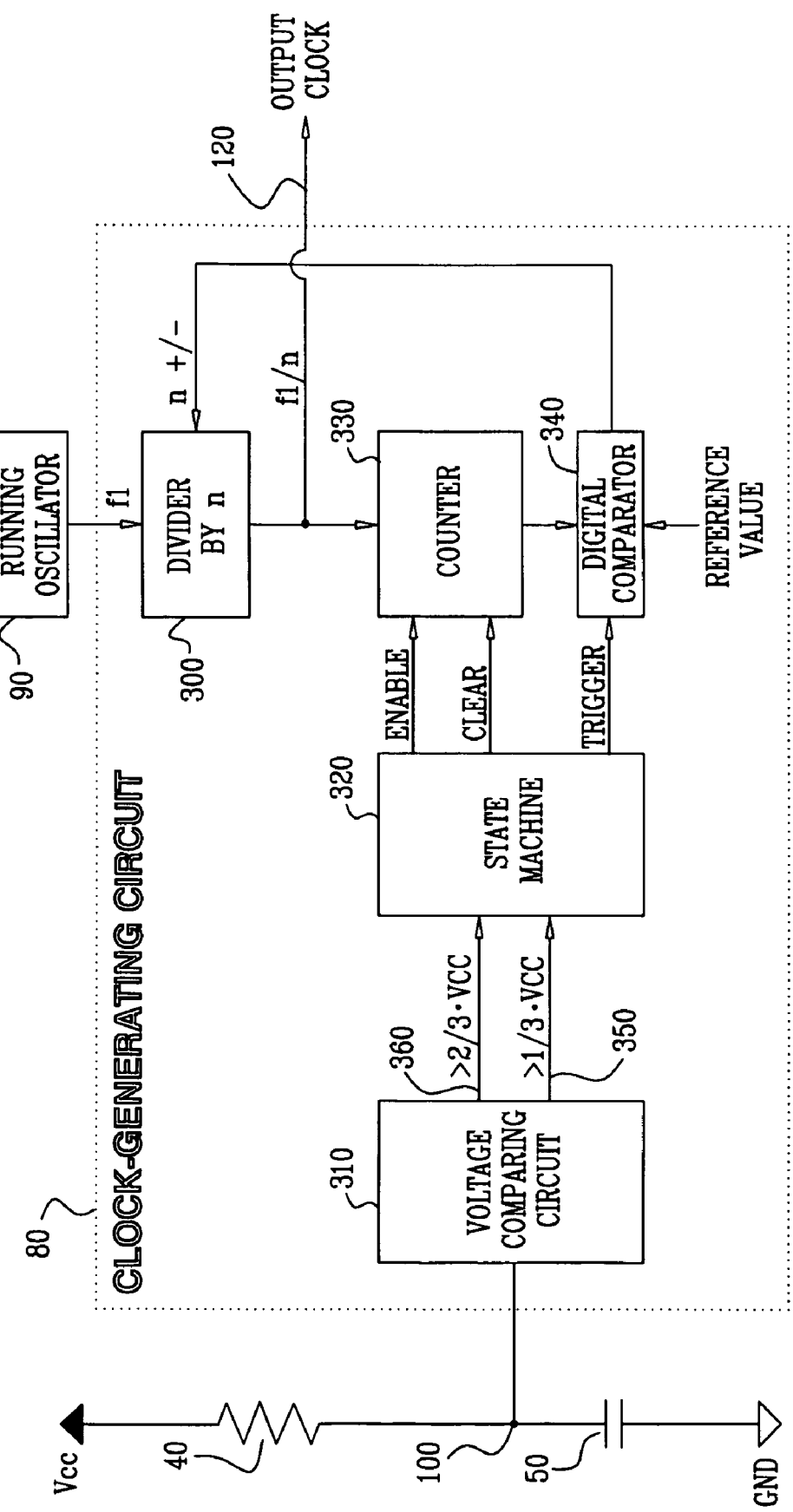
FIG. 5 is a block diagram that schematically illustrates a clock-generating circuit in a single-pin RC oscillator, in accordance with an embodiment of the present invention.

FIG. 5 is a block diagram showing clock generating circuit 80 in greater detail, in accordance with an embodiment of the present invention. Circuit 80 comprises a divider 300, a voltage comparing circuit 310, a state machine 320, a counter 330 and a digital comparator 340. In principle, circuit 80 acts as a frequency divider, which divides the frequency of oscillator 90. The frequency division ratio applied by circuit 80 is determined as a function of the measured duration of the charge period $\tau_1$.

The input of divider 300 is a clock signal at a frequency f1, which is produced by a relatively inaccurate free-running oscillator 90. Divider 300 divides the input clock signal by a certain integer division ratio n, thus producing an output clock signal at a frequency f1/n. (The present example addresses integer division ratios, although fractional division ratios x can also be implemented if desired.)

Frequency f1 of oscillator 90, which is usually implemented within IC device 30, is relatively inaccurate. In order to produce an accurate clock frequency, circuit 80 modifies the division ratio n that is applied by divider 300. Circuit 80 measures the actual frequency of the output clock and adjusts it to the desired frequency by incrementing or decrementing the ratio n. When the measured frequency is below the desired frequency, n is increased, and when the measured frequency is above the desired one, n is decreased.

Voltage comparing circuit 310, which is similar to circuit 130 of FIG. 2 above, produces two output signals 350 and 360. Signal 350 indicates that the voltage across capacitor 50 of RC network 20 exceeds ⅓·Vcc, and signal 360 indicates that the capacitor voltage is below ⅔·Vcc. These two signals trigger state-machine 320 to activate counter 330 and comparator 340. For example, signals 350 and 360 can be input to a logical AND gate, whose output indicates that the capacitor voltage is between ⅓·Vcc and ⅔·Vcc. The output of this AND gate can be used to enable counter 330.

In some embodiments, state machine 320 comprises a mechanism that inhibits counter 330 from being activated during the discharge period. For example, the state machine can inhibit the output of the above-mentioned AND gate during the discharge period, e.g., by using a flip-flop and an additional AND gate (not shown in the figure.) Alternatively, any other suitable mechanism can also be used.

As explained above, during the charging period the capacitor voltage V(t) is fully determined by the parameters of the RC network (R and C), which can be made accurate by appropriate selection of the resistor and capacitor. Therefore, the duration $\tau_1 = t2 - t1$, during which the capacitor voltage rises from ⅓·VCC to ⅔·VCC (see FIG. 4), is also accurate. Furthermore, the response times of the two comparators in the voltage comparing circuit are essentially identical, since both comparators are implemented within the same IC device.

Therefore, the respective delays in triggering signals 350 and 360 are cancelled out and do not affect the measurement of $\tau_1$.

The interval between the initiation times of signals 350 and 360 in a given cycle is referred to herein as a measurement interval. State machine 320 resets counter 330 before the beginning of each measurement interval, and enables the counter during the interval. After the end of the interval, state machine 320 triggers comparator 340 to compare the content of counter 330 with a pre-programmed reference value. If the content is below the reference value, comparator 340 causes divider 300 to decrease n. If the content is above the reference value, comparator 340 causes divider 300 to increase n. Alternatively, comparison and resetting may be performed after m consecutive measurement intervals.

Thus, the frequency of the output clock signal (the output of divider 300) is determined by the reference value used by comparator 340. This value can be predetermined within device 30. Alternatively, this value may be programmed to device 30, thus enabling it to produce output clock signals at various frequencies.

In some embodiments, charge controlling circuit 70 and clock generating circuit 80 operate continuously as described above, such that capacitor 50 is continually charged and discharged. In alternative embodiments, circuits 70 and 80 operate and calibrate the free-running oscillator (i.e., update the division ratio of divider 300) only at predetermined time intervals, in order to reduce the current consumed by charging and discharging the capacitor. The time intervals are separated by respective inactive periods in which the capacitor is not being charged and discharged. For example, calibration can be performed at one-minute intervals, or at any other suitable rate. In some embodiments, the time interval between subsequent calibrations may vary, e.g., depending on the value of the last correction made to the division ratio of divider 300. This feature further reduces the current consumption of the oscillator circuit.

For the sake of conceptual clarity, charge controlling circuit 70 and clock generation circuit 80 were described above as having two separate voltage comparing circuits 130 and 310, respectively. In a typical implementation, however, both circuits may utilize the same voltage comparing circuit.

Although the embodiments described herein mainly address high-accuracy RC clock oscillators, the principles of the present invention can also be used for other applications, as well. For example, a configuration similar to circuit 10 can be used to implement a test instrument for measuring the resistance of a resistor, by using a capacitor whose capacity is known with high accuracy and a frequency source whose frequency is known with high accuracy. A test instrument for measuring capacity can be implemented similarly, using a resistor whose resistance is known with high accuracy.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. Apparatus, comprising:
   a single-pin input interface, which is operative to sense a voltage across a capacitor of a Resistor-Capacitor (RC) network in which the capacitor is repetitively charging and discharging so that the voltage oscillates as a function of time;
   a measurement circuit, which is coupled to measure time durations in which the capacitor is charging and in which the sensed voltage lies between first and second predefined thresholds; and
   a clock generation circuit, which is coupled to generate an output clock signal having a frequency, and to adjust the frequency responsively to the measured time durations, wherein the clock generation circuit comprises:
      a free-running oscillator, which is operative to generate an initial clock signal at an initial frequency;
      a frequency divider, which is operative to process the initial clock signal so as to divide the initial frequency by a programmable division ratio to produce the output clock signal; and
      circuitry, which is coupled to adjust the programmable division ratio responsively to the measured time durations.

2. The apparatus according to claim 1, wherein the measurement circuit comprises first and second comparators, which are respectively operative to compare the voltage to the first and second predefined thresholds, so as to identify the time durations.

3. The apparatus according to claim 2, wherein the first and second comparators have respective first and second performance variations that are matched to one another.

4. The apparatus according to claim 1, wherein the circuitry comprises a counter operative to count cycles of the output clock signal produced by the frequency divider, and wherein the circuitry is coupled to enable the counter to count the cycles during the time durations, and is further coupled to make a comparison between the counted cycles in a given time duration and a predetermined reference value, and to adjust the programmable division ratio of the frequency divider responsively to the comparison.

5. The apparatus according to claim 4, wherein the circuitry is coupled to inhibit the counter from counting the cycles in time intervals in which the capacitor is discharging.

6. The apparatus according to claim 1, wherein the capacitor is charging and discharging only at time intervals separated by respective inactive periods, and wherein the clock generation circuit is coupled to adjust the frequency only during the time intervals.

7. Apparatus, comprising:
   a single-pin input interface, which is operative to sense a voltage across a capacitor of a Resistor-Capacitor (RC) network in which the capacitor is repetitively charging and discharging so that the voltage oscillates as a function of time;
   a measurement circuit, which is coupled to measure time durations in which the capacitor is charging and in which the sensed voltage lies between first and second predefined thresholds; and
   a clock generation circuit, which is coupled to generate an output clock signal having a frequency, and to adjust the frequency responsively to the measured time durations, wherein the capacitor is charging and discharging only at time intervals separated by respective inactive periods, and wherein the clock generation circuit is coupled to adjust the frequency only during the time intervals, and wherein the clock generating circuit is coupled to determine a length of a given inactive period responsively to a magnitude of a frequency adjustment applied in a given time interval that precedes the given inactive period.

8. A method, comprising:
   sensing, via a single-pin input interface, a voltage across a capacitor of a Resistor-Capacitor (RC) network in which the capacitor is repetitively charging and discharging so that the voltage oscillates as a function of time;

measuring time durations in which the capacitor is charging and in which the sensed voltage lies between first and second predefined thresholds;
generating an output clock signal having a frequency; and
adjusting the frequency of the output clock signal responsively to the measured time durations,
wherein generating the output clock signal comprises:
generating an initial clock signal at an initial frequency;
processing the initial clock signal so as to divide the initial frequency by a programmable division ratio to produce the output clock signal; and
adjusting the programmable division ratio responsively to the measured time durations.

9. The method according to claim 8, wherein measuring the time durations comprises comparing the voltage to the first and second predefined thresholds using respective first and second comparators.

10. The method according to claim 9, wherein the first and second comparators have respective first and second performance variations, and wherein measuring the time durations comprises assembling the first and second comparators so as to match the first and second performance variations to one another.

11. The method according to claim 8, wherein adjusting the programmable division ratio comprises counting cycles of the output clock signal during the time durations, making a comparison between the counted cycles in a given time duration and a predetermined reference value, and setting the programmable division ratio responsively to the comparison.

12. The method according to claim 11, wherein adjusting the programmable division ratio comprises refraining from counting the cycles in time intervals in which the capacitor is discharging.

13. The method according to claim 8, wherein the capacitor is charging and discharging only at time intervals separated by respective inactive periods, and wherein adjusting the frequency comprises modifying the frequency only during the time intervals.

14. A method, comprising:
sensing, via a single-pin input interface, a voltage across a capacitor of a Resistor-Capacitor (RC) network in which the capacitor is repetitively charging and discharging so that the voltage oscillates as a function of time;
measuring time durations in which the capacitor is charging and in which the sensed voltage lies between first and second predefined thresholds;
generating an output clock signal having a frequency; and
adjusting the frequency of the output clock signal responsively to the measured time durations,
wherein the capacitor is charging and discharging only at time intervals separated by respective inactive periods, and wherein adjusting the frequency comprises modifying the frequency only during the time intervals,
and comprising determining a length of a given inactive period responsively to a magnitude of a frequency adjustment applied in a given time interval that precedes the given inactive period.

15. Apparatus, comprising:
an oscillator, comprising:
a single-pin input interface, which is operative to sense a voltage across a capacitor of a Resistor-Capacitor (RC) network, in which the capacitor is charged and discharged so that the voltage oscillates as a function of time;
a measurement circuit, which is coupled to measure time durations in which the capacitor is charged and in which the sensed voltage lies between first and second predefined thresholds; and
a clock generation circuit, which is coupled to generate an output clock signal having a frequency, and to adjust the frequency responsively to the measured time durations; and
digital computing circuitry, which is configured to perform computational operations using the output clock signal,
wherein the clock generation circuit comprises:
a free-running oscillator, which is operative to generate an initial clock signal at an initial frequency;
a frequency divider, which is operative to process the initial clock signal so as to divide the initial frequency by a programmable division ratio to produce the output clock signal; and
circuitry, which is coupled to adjust the programmable division ratio responsively to the measured time durations.

16. The apparatus according to claim 15, wherein the measurement circuit comprises first and second comparators, which are respectively operative to compare the voltage to the first and second predefined thresholds, so as to identify the time durations.

17. The apparatus according to claim 15, wherein the circuitry comprises a counter operative to count cycles of the output clock signal produced by the frequency divider, and wherein the circuitry is coupled to enable the counter to count the cycles during the time durations, and is further coupled to make a comparison between the counted cycles in a given time duration and a predetermined reference value, and to adjust the programmable division ratio of the frequency divider responsively to the comparison.

18. The apparatus according to claim 17, wherein the circuitry is coupled to inhibit the counter from counting the cycles in time intervals in which the capacitor is discharging.

19. The apparatus according to claim 15, wherein the capacitor is charging and discharging only at time intervals separated by respective inactive periods, and wherein the clock generation circuit is coupled to adjust the frequency only during the time intervals.

20. Apparatus, comprising:
an oscillator, comprising:
a single-pin input interface, which is operative to sense a voltage across a capacitor of a Resistor-Capacitor (RC) network, in which the capacitor is charged and discharged so that the voltage oscillates as a function of time;
a measurement circuit, which is coupled to measure time durations in which the capacitor is charged and in which the sensed voltage lies between first and second predefined thresholds; and
a clock generation circuit, which is coupled to generate an output clock signal having a frequency, and to adjust the frequency responsively to the measured time durations; and
digital computing circuitry, which is configured to perform computational operations using the output clock signal,
wherein the capacitor is charging and discharging only at time intervals separated by respective inactive periods, and wherein the clock generation circuit is coupled to adjust the frequency only during the time intervals, and
wherein the clock generating circuit is coupled to determine a length of a given inactive period responsively to a magnitude of a frequency adjustment applied in a given time interval that precedes the given inactive period.

* * * * *